(12) United States Patent
Becker et al.

(10) Patent No.: US 7,284,992 B2
(45) Date of Patent: Oct. 23, 2007

(54) ELECTRONIC PACKAGE STRUCTURES USING LAND GRID ARRAY INTERPOSERS FOR MODULE-TO-BOARD INTERCONNECTION

(75) Inventors: Wiren Dale Becker, Hyde Park, NY (US); William Louis Brodsky, Binghamton, NY (US); Evan George Colgan, Chestnut Ridge, NY (US); Michael Ford McAllister, New Milford, CT (US); Edward Seminaro, Milton, NY (US); John Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/386,343

(22) Filed: Mar. 22, 2006

(65) Prior Publication Data
US 2007/0224845 A1 Sep. 27, 2007

(51) Int. Cl.
*H01R 12/00* (2006.01)

(52) U.S. Cl. .......................................... 439/66; 439/67
(58) Field of Classification Search .................. 439/66, 439/67, 55, 586, 591; 361/785, 705
See application file for complete search history.

(56) References Cited

U.S. PATENT DOCUMENTS

| | | | |
|---|---|---|---|
| 5,893,765 A * | 4/1999 | Farnworth | 439/91 |
| 6,168,442 B1 * | 1/2001 | Naoi | 439/91 |
| 2005/0142900 A1 * | 6/2005 | Boggs et al. | 439/66 |
| 2006/0163713 A1 * | 7/2006 | Tokunaga | 257/686 |
| 2006/0199402 A1 * | 9/2006 | Ishii et al. | 439/66 |
| 2007/0015375 A1 * | 1/2007 | Weiss | 439/66 |

* cited by examiner

*Primary Examiner*—Hien Vu
(74) *Attorney, Agent, or Firm*—F. Chau & Associates, LLC; Frank V. DeRosa (57) ABSTRACT

Apparatus and methods are provided for constructing electronic package structures using LGA (land grid array) module-to-board connectors that are designed to provide higher count I/O interconnections by expanding LGA area, but without having to increase chip module footprint or reduce the pitch of area array I/O contacts of an LGA interposer or circuit board beyond practical limits.

14 Claims, 8 Drawing Sheets

ELECTRONIC PACKAGE STRUCTURES USING LAND GRID ARRAY INTERPOSERS FOR MODULE-TO-BOARD INTERCONNECTION

TECHNICAL FIELD OF THE INVENTION

The present invention generally relates to apparatus and methods for constructing electronic package structures using LGA (land grid array) techniques for module-to-board connection. In particular, the present invention relates to apparatus and methods for constructing high-performance electronic modules (such as processor modules for computer systems) using LGA techniques for module-to-board connection, which provide higher count I/O interconnections by expanding LGA area without increasing chip module footprint or reducing the pitch of area array I/O contacts of an LGA interposer or circuit board beyond practical limits. The present invention further relates to packaging structures that allow integration of VPD (vital product data) modules into first level chip module assemblies in a tamper resistant manner.

BACKGROUND

Innovations in semiconductor fabrication and packaging technologies have enabled development of smaller scale, higher density integrated circuit chips, as well as the development of highly integrated chip modules with wiring and area array I/O contact densities that enable dense packaging of IC chips. In certain applications, high-performance electronic modules can be constructed with one or more MCMs (multi-chip modules) mounted to a circuit board such as a system board (or node card), a PCB (printed circuit board), a PWB (printed wiring board), etc, using a suitable area array connection technique for module-to-board I/O interconnections. By way of example, high performance computer systems are typically designed with high-performance processor modules having first level packages (chip modules) constructed using MCM technology to achieve high-density packaging of large numbers of IC processor chips, as well as LGA technology to achieve high-density and high-count I/O interconnections to a second level package (e.g., node card).

Current MCM technology using glass-ceramic substrates can readily accommodate the higher I/O and power density requirements for compact, high performance package designs. In general, state of the art MCM techniques allow a plurality of IC chips to be flip-chip bonded to a ceramic module substrate using small pitch, highly dense arrays of micro-solder ball interconnects formed between bonding pads on the active surfaces of the IC chips and matching arrays of contact pads formed on a chip mounting surface on the ceramic substrate. For example, with glass-ceramic technology, high-density arrays of contact pads with on center contact pitches in the range of 0.15 to 0.25 mm, for example, can be formed on the top side substrate surface. Moreover, glass-ceramic MCM technology supports the wiring densities that are required for escape routing from the top side high-density contact arrays to, e.g., other chips on the substrate and to high density arrays of I/O contacts formed on the bottom side of the MCM substrate for module I/O.

For high-performance package designs, LGA techniques enable direct interconnection between corresponding area arrays of I/O contacts formed on mating surfaces of a chip module (e.g., MCM) and circuit board using a conductive interposer that is compressed between the module and board. Various types of LGA interposer structures have been developed which generally include, for example, rigid, semi-rigid and flexible substrate structures having arrays of electrical contacts formed by, e.g., compressible conductive spring structures, conductive metal-elastomer composites, wadded wire, etc. State of the art LGA techniques enable MCM-to-board interconnections with I/O interconnect densities/counts and electrical/mechanical properties that are desirable for high-performance CPU module designs. Moreover, LGA provides electrical and mechanical interconnect techniques that allow MCM chip modules to be readily removable from circuit boards, which is advantageous for high-end modules such as CPU packages which may require repeated rework during production or are designed to be field-upgradeable.

Figure 1A:
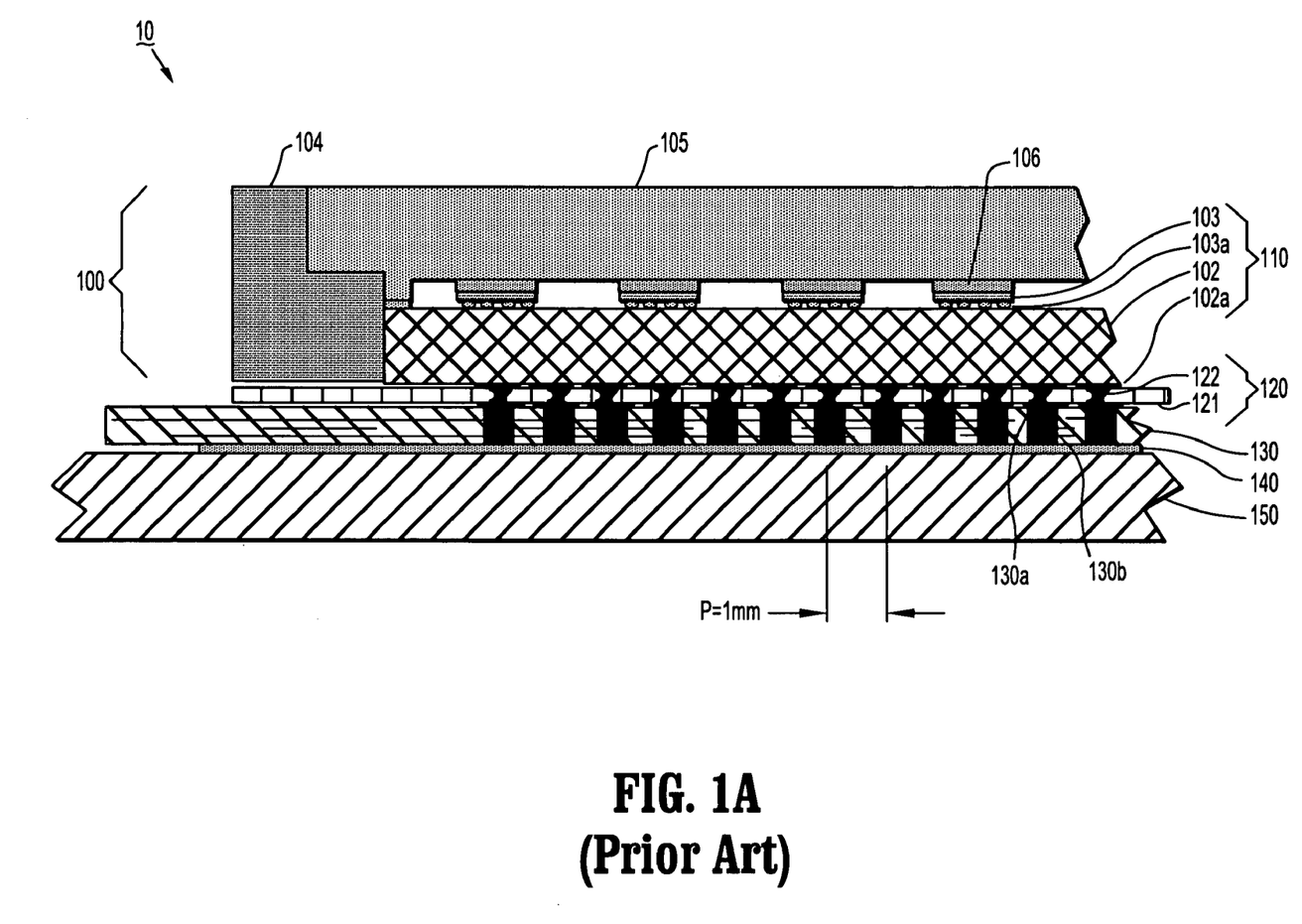
FIGS. 1A-1B schematically illustrate an electronic apparatus having a conventional packaging structure using LGA for module-to-board I/O interconnection.
Figure 1B:
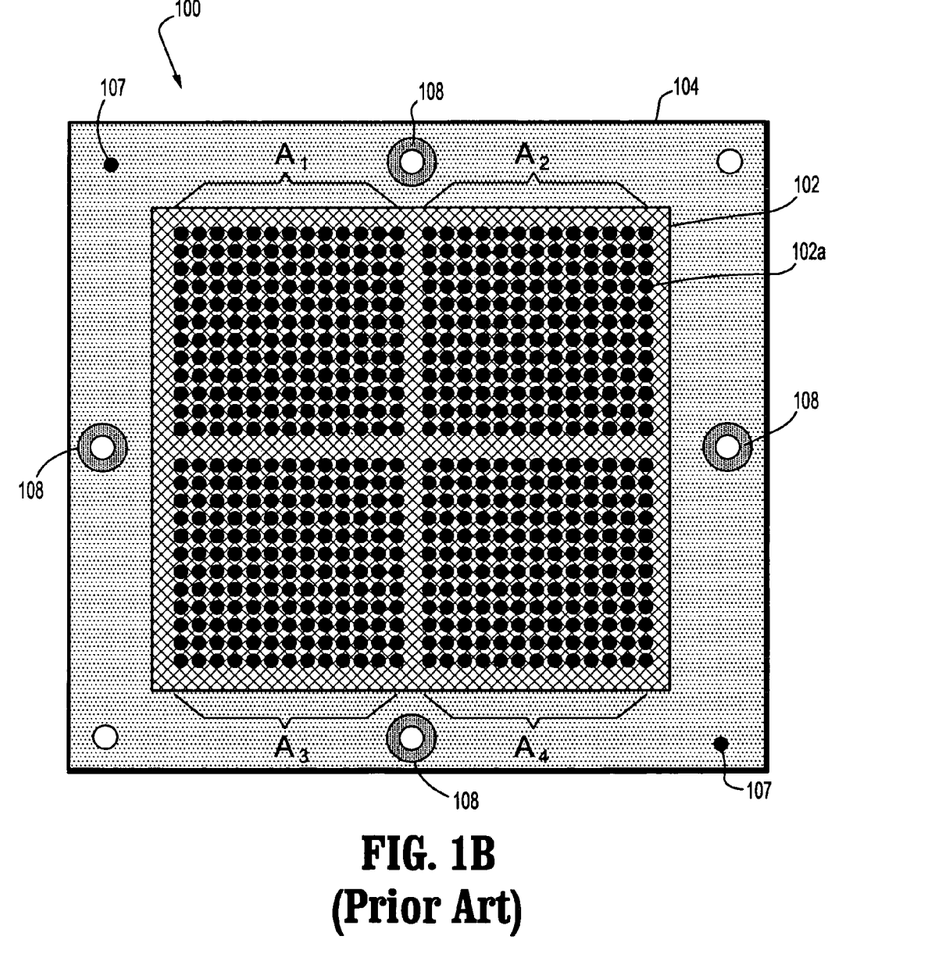

FIGS. 1A and 1B schematically illustrate an electronic apparatus having a conventional LGA packaging structure for module-to-board I/O interconnection. FIG. 1A is a schematic cross-sectional side-view of an electronic apparatus (10) which generally comprises a chip module assembly (100), an LGA interposer (120), an electrical circuit board (130) and insulator layer (140) and a stiffener plate (150). The chip module assembly (100) comprises an MCM (multi-chip module) (110), a metallic support frame structure (104) and a thermal hat (105). The MCM (110) includes a module substrate (102) with a plurality of IC chips (103) flip-chip mounted to an array of contacts formed on the top surface of the substrate (102) via micro-solder balls (103a). The substrate (102) includes multiple levels of wiring and interconnects that provide electrical connections between top side contacts, other top side contacts, or an area array of I/O contacts (102a) formed on the bottom side of the substrate (102).

FIG. 1B is a schematic plan view of the bottom surface of the chip module assembly (100), which illustrates the bottom surfaces of the support frame (104) and the MCM substrate (102). The support frame (104) is designed to surround the perimeter of the MCM substrate (102). The support frame (104) includes various mechanical components (107) and (108) to support LGA alignment and actuation, as explained below. FIG. 1B illustrates a layout pattern of the I/O contacts (102a) on the bottom side of the substrate (102). In the exemplary embodiment, the area array of I/O contacts (102a) are arranged in 4 rectangular arrays (A1, A2, A3, A4) of evenly spaced metallized I/O pads, where the arrays are separately located in one of 4 quadrants on the bottom surface of the MCM substrate (102).

Referring again to FIG. 1A, the circuit board (130) includes an area array of contact pads (130a) on a top surface of the board (130) having a layout pattern matched to that of the area array of I/O contacts (102a) on the bottom of the MCM substrate (102). The board (130) includes conductive through vias (130b) formed within the board (130) below the contacts (130a). The board (130) includes multiple levels of wiring with connections to the conductive vias (130b) to thereby route I/O signals and power to the contacts (130a). The insulator sheet (140) electrically isolates the board (130) from the stiffener plate (150).

The LGA interposer (120) functions as a direct electrical interface to connect the I/O contacts (102a) on the bottom of the MCM substrate (102) to matching I/O contacts (130a) on the upper surface of the circuit board (130). The LGA interposer (120) includes an insulating substrate (121) having an array of interposer connectors (122) aligned with corresponding I/O contacts (102a) on the bottom of the MCM substrate (102) and contacts (130a) on the top surface of the board (130). The interposer connectors (122) directly interface with the contacts (102a) and (130a). The LGA interposer (120) in FIG. 1A has a conventional "wadded wire contact" type LGA interposer framework, which comprises a substantially rigid plastic frame (121) having an array of wadded wire connectors (122) disposed in apertures in the plastic frame (121). The wadded wire connectors (122) are formed of a deformable, randomly configured, resilient conductor material held by friction within the plastic frame (121). The wadded wire connectors (122) provide direct connections between corresponding contacts on the MCM and board.

In general, the multichip module (110), LGA interposer (120), and circuit board (130) form a stacked structure, which is fixedly held together using a compression force applied by a hardware actuation structure to compress the LGA interposer (120) between the chip module (110) and board (130) with a force that is sufficient to ensure proper actuation of the LGA connectors (122). The support frame (104), package thermal hat (105) and stiffener plate (150) are mechanical components that serve various purposes including, e.g., mechanical support, thermal cooling, uniform loading of compression forces for LGA actuation, etc. For instance, the thermal hat (105) serves as a protective package lid as well as a heat spreader for cooling the IC chips (103). A thermal paste layer (106) is disposed between the back surface of the chips (103) and the thermal hat (105). The thermal paste (106) provides mechanical compliance and serves as a primary thermal path to transfer heat from the IC chips (103) to the thermal hat (105). An air cooled heat sink or a liquid cooled cold plate can be coupled to the thermal hat (105) to remove heat using known methods.

The metal support frame (104) serves to mechanically support the MCM (110), the thermal hat (105) and associated heat sink device mounted on top of the thermal hat (105). As shown in FIGS. 1A and 1B, the support frame (104) is designed to surround the outer perimeter of the MCM substrate (102). A silicone based adhesive is commonly used to bond a projection portion of the thermal hat (105) to the top surface of the MCM substrate (102) to form a semi-hermetic region around the ICs. Typically, the support frame (104) and the thermal hat (105) are bolted together.

The supporting frame (104) includes mechanisms to enable package assembly and LGA actuation. For instance, as shown in FIG. 1B, the support frame (104) includes alignment pins (107) which protrude from the bottom surface of the support frame (104) at two opposite corners thereof. These alignment pins (107) are aligned to, and mate with, alignment holes that are formed in the LGA interposer (120) and circuit board (130), to ensure proper alignment of I/O connections between the chip module (110) and board (130) through the LGA interposer (120). Moreover, hardware (108) is provided at the center of each side, for example, of the MCM (100) as part of the LGA actuation structure.

Typically, LGA actuation is achieved using stiff springs which act to pull the MCM assembly (100) towards the stiffener plate (150) with a force that is sufficient to compress the LGA (120) between the MCM (110) and board (130). The supporting frame (104) and thermal hat (105) essentially form a top loading plate which acts to uniformly distribute the load around the top perimeter of the MCM substrate (102) which further distributes the load and the stiffener plate (150) which is a bottom loading plate which acts to uniformly distribute the load across the system board (120), to thereby ensure uniform compression force across the LGA contact area. Only a minimal, if any, load is transferred through the thermal hat to the thermal paste layer and to the ICs (103) mounted on the MCM substrate (102).

FIG. 1A illustrates a conventional package structure in which MCM and LGA technologies can be utilized to construct compact, high performance electronic modules, such as CPU modules, having highly-density chip modules with high density I/O module-to-board interconnections. For area array package structures such as depicted in FIG. 1A, the package footprint (i.e. MCM substrate (102) size) is based, primarily in part, on the number of I/O connections (I/O count) that are needed for a given design as well as the I/O contact density (I/O pitch). As chip modules are constructed with higher chip densities and functionality requiring higher I/O counts, the modules must be designed with smaller I/O pitch to either maintain or reduce the chip module footprint. In other words, smaller I/O pitch for the module-to-board interconnections allows higher-I/o-count chip modules to be formed using smaller substrate size, thus lowering package costs.

Although current MCM and LGA interposer technologies can achieve high I/O densities (I/O pitch less than 1 mm), the I/O interconnect density in conventional package structures such as depicted in FIG. 1A has currently reached a practical pitch limit of 1 mm. This limit is governed primarily by economics and manufacturing requirements of circuit board fabrication, which mandate the use of low-cost and high production/high yield board fabrication methods. However, state of the art board fabrication technologies (e.g., sequential lamination method) that meet such requirements are not able to provide the wiring densities needed to support I/O contact arrays having I/O pitch less than 1 mm. Although fine-pitch organic package technologies (e.g., "build-up" layers which are used in first level packages to which chips are directly attached) may be used in lieu of conventional PCB to construct system boards or node cards, it is too expensive to fabricate an entire system board or node card, for example, using such organic package technologies.

Consequently, in the package design of FIG. 1A, the I/O density is limited by the 1 mm contact pitch of the area array (130a) of the board (130). In this regard, the ability to use smaller scale MCM structures is effectively limited by the amount of electrical contacts needed to meet I/O and power requirements (bottom surface area) for the given application rather than the number and size of the chips (top surface area). As the number of I/O increases, if the I/O density cannot be increased, the MCM package size must be increased to accommodate more I/O contacts. Since MCM structures are very expensive to fabricate, it is desirable to increase the I/O available on the bottom surface of an MCM without increasing the MCM area and without decreasing the pitch of contacts on a PCB or node card or an LGA connector beyond practical limits.

Another challenge that is faced in the design of large and small computer systems is providing a mechanism to ensure that correctly licensed and purchased hardware is being used. For instance, vital product data (VPD), such as information on the number of processors activated in a system (which may be less than the actual number of processors present on the MCM) should be stored in a secure and tamper resistant manner. Moreover, when functions are added, or more processors are activated, the VPD information must be updated. Also, when MCMs are moved from one system board to another, new code must be loaded into the service element and the configuration files updated for the new hardware from the VPD.

Historically, to insure that the hardware was configured properly and that license agreements were being complied with, a special chip was included in an MCM containing the VPD and monitoring or verification electronics. In current computer systems, this approach is no longer being used due to the need to fit larger numbers of processors on each MCM, resulting in reduced security and control. In this regard, improved packaging methods are needed to integrate a VPD module, containing the VPD information and monitoring or verification electronics, in a tamper resistant manner into the MCM packaging without mounting the VPD module on the chip mounting (top) surface of the MCM substrate.

SUMMARY OF THE INVENTION

In general, exemplary embodiments of the invention include apparatus and methods for constructing electronic package structures using LGA (land grid array) for module-to-board I/O interconnections. Exemplary embodiments of the invention include apparatus and methods for constructing high-performance electronic modules (such as processor modules for computer systems) using module-to-board LGA connectors that are designed to provide higher count I/O interconnections by expanding LGA area but without having to increase chip module footprint or reduce the pitch of area array I/O contacts of an LGA interposer or circuit board beyond practical limits.

In general, flexible circuit structures, which are formed with arrays of I/O contacts, are connected to first level chip module assemblies to increase the number of module I/O contacts without increasing the footprint of the chip module. The flexible circuit structures are connected to the first level chip module in a manner that increases the LGA contact area beyond the chip module footprint. Thereafter, module-to-board I/O interconnections are readily achieved using LGA interposer structures and circuit boards that are formed with area arrays of matching I/O contacts to accommodate the additional chip module I/O contacts and LGA area provided by the flexible circuits.

More specifically, in one exemplary embodiment, an electronic apparatus includes a first level package structure, a second level package structure, and an LGA (land grid array) connector disposed between the first and second level package structures. The first level package structure includes a package substrate with one or more IC (integrated circuit) chips mounted on a first surface of the package substrate and an first array of contacts of pitch P1 formed on a second surface of the package substrate opposite the first surface. The second level package structure includes a second array of contacts of pitch P1. The LGA connector provides electrical interconnections between the first and second array of contacts. The first level package structure further includes a flexible circuit having a third array of contacts with pitch P1, a fourth array of contacts with pitch P2, and wiring to connect the third and fourth array of contacts. The LGA connector provides electrical connections between the third array of contacts and the second array of contacts. The fourth array of contacts provide electrical connections between the flexible circuit and the first level package structure.

In another exemplary embodiment of the invention, an electronic module includes an MCM (multi-chip module), an electrical circuit board, an LGA (land grid array) connector disposed between the MCM and the electrical circuit board. The MCM includes a ceramic substrate having a plurality of IC(integrated circuit) chips mounted on a first surface of the ceramic substrate and a first array of contacts of pitch P1 formed on a second surface of the ceramic substrate opposite the first surface. A support frame structure is disposed around an outer perimeter of the ceramic substrate. The electrical circuit board includes a second array of contacts of pitch P1, and the LGA connector provides electrical connections between the first and second array of contacts. The electronic apparatus further includes a flexible circuit having a third array of contacts with pitch P1, a fourth array of contacts with pitch P2, and wiring to connect the third and fourth array of contacts. The fourth array of contacts are electrically connected to contacts on the ceramic substrate, and the LGA connector provides electrical connections between the third and second array of contacts.

Exemplary embodiments of the invention further include packaging structures that allow integration of VPD (vital product data) modules into first level chip module assemblies in a tamper resistant manner. In one exemplary embodiment of the invention, a VPD module can be securely integrated into an MCM package by forming a compartment in a metal support frame of the MCM which would contain the VPD module. The VPD module can be electrically connected to the MCM using a flexible circuit structure.

More specifically, in one exemplary embodiment of the invention, an electronic apparatus includes a first level chip module comprising a substrate having one or more IC (integrated circuit) chips mounted on a first surface of the substrate. The apparatus further includes a support frame structure which is disposed around an outer perimeter sidewall surface of the substrate. The support frame comprises a cavity formed therein, wherein at least a portion of the cavity region is formed adjacent to, and exposes, a surface region of the substrate. A VPD module is disposed in the cavity of the support frame. The VPD module is electrically connected to signal pads on the exposed surface region of the substrate using a flexible circuit.

These and other exemplary embodiments, aspects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 2A:
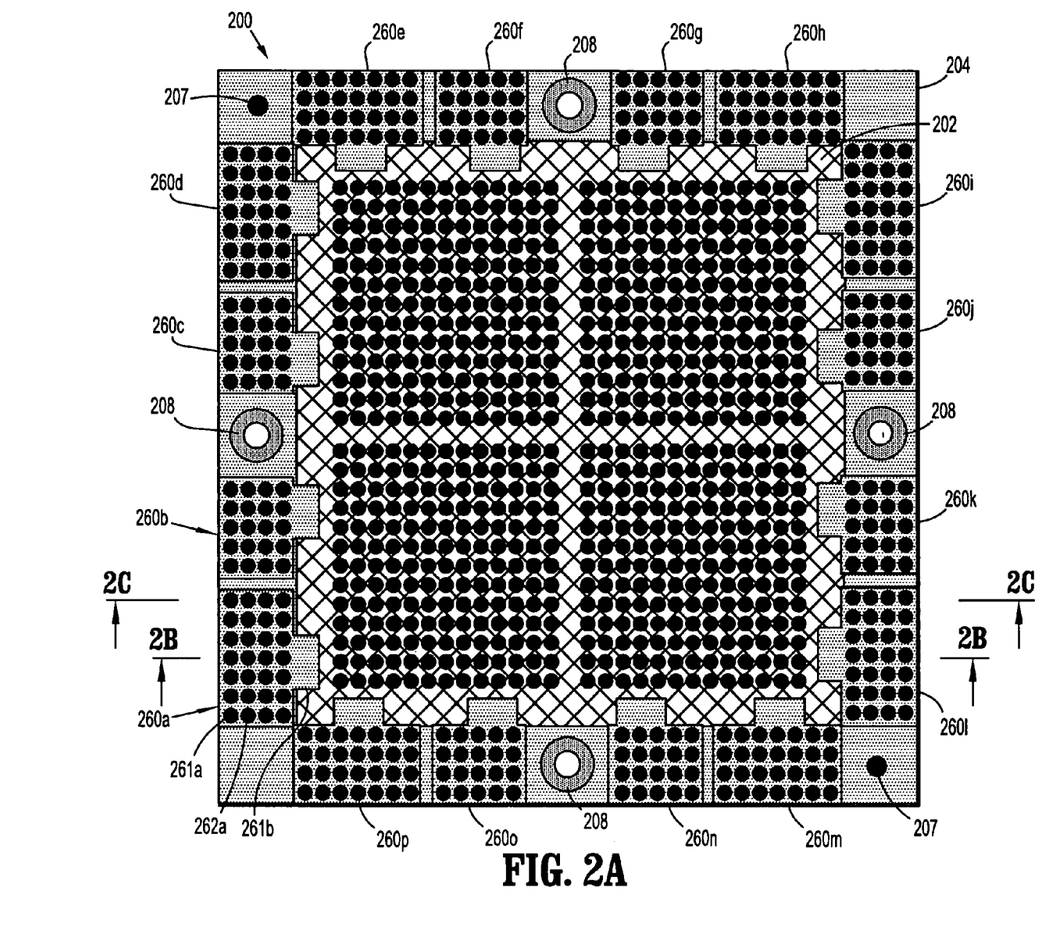
FIGS. 2A-2C schematically depict an electronic package structure in which flexible circuit structures are used to expand LGA contact area to provide higher I/O module-to-board interconnections, according to an exemplary embodiment of the invention.
Figure 2B:
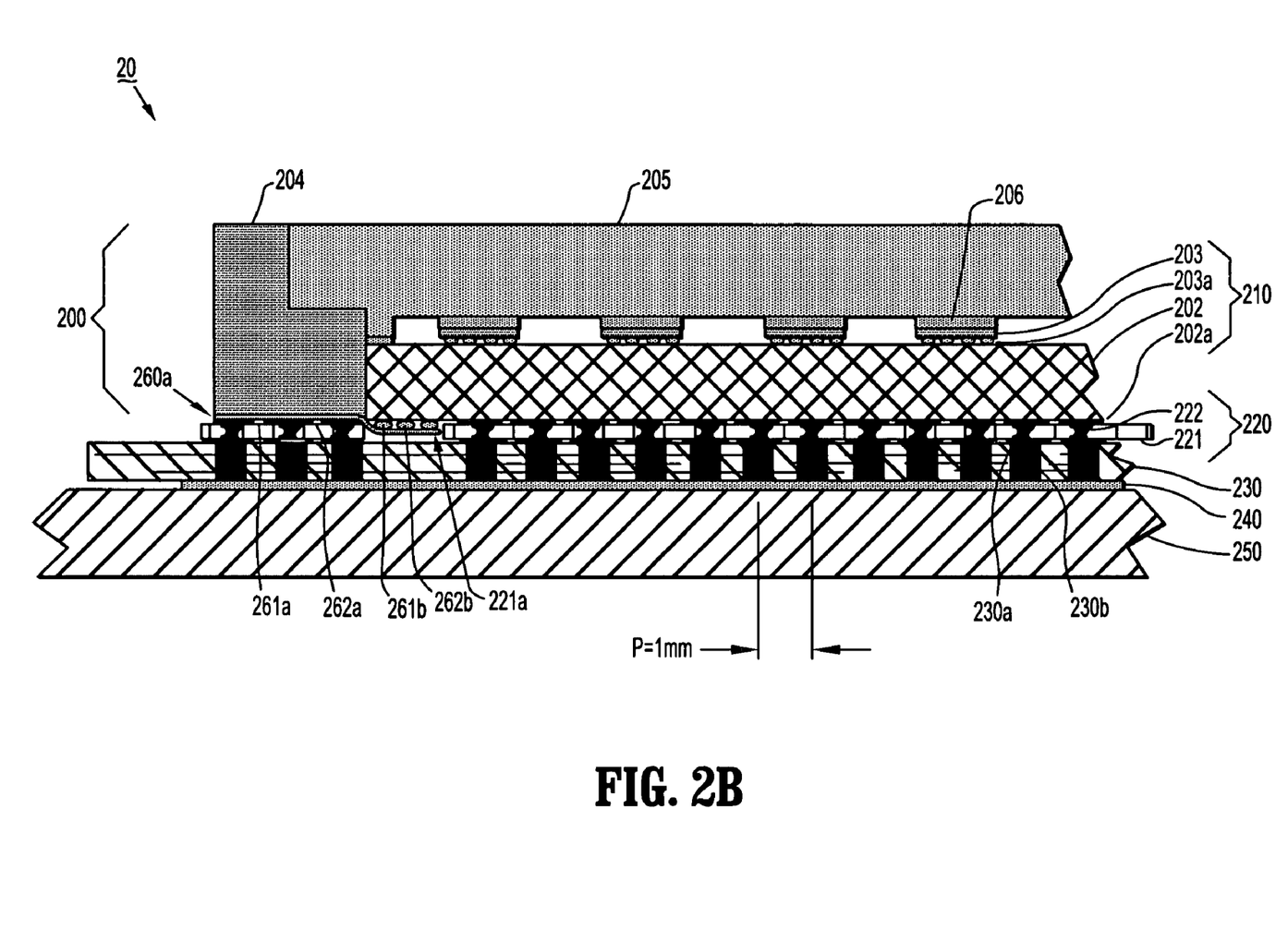
Figure 2C:
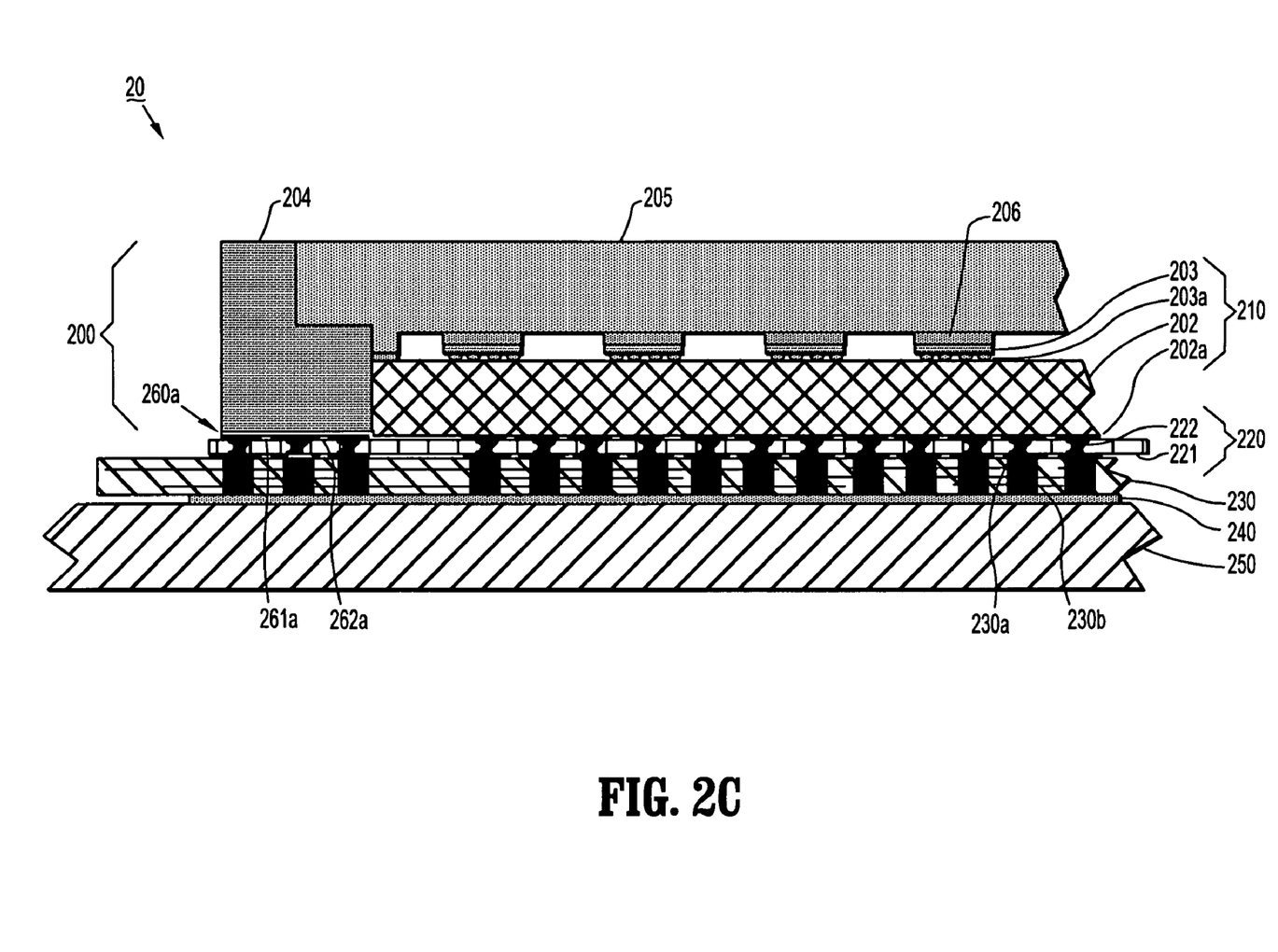

FIGS. 2A-2C schematically depict an electronic package structure in which flexible circuit structures are used to expand the LGA contact area to provide higher I/O module-to-board interconnections, according to an exemplary embodiment of the invention. FIGS. 2B and 2C are schematic cross-sectional side-views of an electronic apparatus (20) which generally comprises a chip module assembly (200), an LGA interposer (220), an electrical circuit board (230) an insulator layer (240) and a stiffener plate (250). The chip module assembly (200) comprises an MCM (multi-chip module) (210), a metallic support frame structure (204) and a thermal hat (205). The MCM (210) includes a carrier substrate (202) with a plurality of IC chips (203) flip-chip mounted to an array of contacts formed on the top surface of the substrate (202) via micro-solder balls (203a). A thermal paste layer (206) is disposed between the back surface of the chips (203) and the thermal hat (205). The substrate (202) includes multiple levels of wiring and interconnects that provide electrical connections between top side contacts and other top side contact or an area array of I/O contacts (202a) formed on the bottom side of the substrate (202).

In general, the exemplary electronic package (20) has a stacked framework of components similar to that as described with reference to FIG. 1A and, therefore, a detailed explanation is not required. However, the electronic package structure (20) has a modified package design in which the LGA area is expanded beyond the footprint of the chip module (210) to provide additional I/O interconnections in the region under the frame (204). In one exemplary embodiment, the LGA area is increased using flexible circuits that are connected to, and extend from, peripheral regions of the MCM substrate (202) to provide additional area array I/O contacts in the region surrounding the MCM substrate (202) under the support frame (204). Moreover, to accommodate the added I/O contacts, the area array of contacts of the LGA interposer (220) and board (230) are expanded in the region under the support frame (204) to provide increased module-to-board I/O interconnections.

More specifically, FIG. 2A is a schematic plan view of the bottom surface of the chip module assembly (200), which illustrates the use of flexible circuits to expand the LGA area. In FIG. 2A, the support frame (204) surrounds the outer perimeter of the ceramic substrate (202) and includes alignment pins (207) and actuation hardware (208), such as that described with reference to FIG. 1B. Moreover, as depicted in FIG. 2A, the array of I/O contact (202a) on the bottom of the MCM substrate (202) is formed of separate 4 arrays (or quadrants) of I/O contact, similar to those arrays A1-A4 in FIG. 1B.

To increase LGA area without increasing the footprint of the MCM substrate (202) or changing the pitch of the matching pads on the electronic circuit board (230), a plurality of flexible circuits (260a- 260p) having arrays of I/O contacts are arranged around the MCM substrate (202) under the support frame (204) and connected to the MCM substrate (202) using wiring and contacts formed on the flexible circuits. In general, a flexible circuit can be any structure having a printed circuit formed on a thin, flexible, bendable dielectric substrate. For example, a flexible circuit may be constructed with a polyimide substrate having an array of contacts and wiring formed from etched copper. The flexible circuits can be single sided, double sided, or multi-layer structures.

More specifically, as depicted in FIGS. 2A, 2B and 2C, a flexible circuit (260a) includes a flexible substrate (261a/261b) with an array of I/O contacts (262a) formed on a portion of the substrate (261a) located under the bottom of the frame (204). Moreover, a portion of the substrate (261b) is disposed over a region of the bottom surface of the MCM substrate (202), and includes an array of contacts that are connected to I/O contacts on the MCM substrate (202) using fine pitch solder balls (262b) (as depicted in FIG. 2B) (e.g., 0.3 to 0.5 mm pitch, for example). Alternately, the flexible circuit could be connected to the MCM by directly soldering the flexible circuit to the MCM, using a conductive adhesive, or by use of an anisotropic conductive film (although fine pitch solder balls is one preferred method). The flexible circuit (260a) is constructed with wiring to fan-out from the fine pitch I/O interconnections between the MCM substrate (202) and the substrate region (261b) to the I/O pads (262a) (e.g., 1 mm pitch) located on the region (261a) under the support frame (204). The flexible circuit can be adhesively bonded to the bottom surface of the support frame (204) using a material such as a film of a pressure sensitive adhesive. It is to be understood that the flexible circuits could be designed to attach to the top surface of the MCM substrate (202), depending on the application.

The I/O contacts provided by the flexible circuits (260a-260p) in the region under the frame (204) allow the I/O of the MCM (210) to be increased without increasing the footprint of the MCM substrate (202) or reducing the I/O pitch. As depicted in FIGS. 2B and 2C, the array of contacts (230a) on the board (230) is matched to the array of I/O contacts formed on the bottom of the MCM substrate (202) as well as the flexible circuits in the region under the frame (204). The LGA interposer (220) is constructed to extend under the frame (204) with a matching array of connectors to accommodate the additional chip module I/O contacts provided by the flexible circuits (260a-260p).

In one exemplary embodiment of the invention as shown in FIGS. 2B and 2C, the LGA interposer (220) is a "wadded wire contact" type LGA interposer which comprises a substantially rigid plastic frame (221) having an array of wadded wire connectors (222) disposed in apertures in the plastic frame (221). The wadded wire connectors (222) are formed of a deformable, randomly configured, resilient conductor material held by friction within the plastic frame (221). The wadded wire connectors (222) provide direct connections between corresponding contacts on the MCM and board. The LGA interposer (220) having a "wadded wire contact" type framework is particularly useful when using flexible circuits to expand the LGA area. For instance, the rigid frame (221) provides a rigid surface that acts as a down stop for the compression force which is needed for LGA actuation in the region under the support frame (204) as well as the region under the substrate (202). It is to be understood that other types of LGA structures (instead of the "wadded wire contact") may be employed in conjunction with flexible circuits as described above, as long as the LGA structures have a thickness that is greater than the total thickness of flexible circuit and the means used to electrically connect the flexible circuit to the MCM substrate.

In the exemplary embodiment of FIGS. 2A-2C, the package structure (20) is designed with features to accommodate space needed for the flexible circuit. For instance, in one exemplary embodiment, referring to FIG. 2B, the bottom surface of the support frame (204) can be made substantially flush (i.e., coplanar) with the bottom surface of the substrate (202), but slightly recessed below the bottom of the substrate (202) by a distance approximately equal to the thickness of the flexible circuit (260a) so that the surface of the I/O pads (262a) on the portion of the flexible substrate (261a) are coplanar with the I/O pads (202a) on the bottom of the MCM substrate (202). In practice, the I/O pads (262a) do not need to be precisely coplanar with the I/O pads (202a) on the bottom of the MCM substrate (202) when the LGA interposer (220) can provide some vertical compliance.

In other exemplary embodiments, the LGA interposer (220) is constructed to have cavities or apertures formed in regions of the LGA frame (221) that align to regions of the area array where the flexible circuits are electrically attached to the MCM substrate (202) so as to provide clearance for the attachment to the MCM. For instance, FIG. 2B is a cross sectional view of the chip module assembly (200) taken along line 2B-2B in FIG. 2A, wherein it is shown in FIG. 2B that a portion (221a) of the LGA interposer substrate (221) is removed to provide the space needed to accommodate the thickness of the flexible circuit substrate (261b) and fine pitch solder balls (262b). Although the flexible circuit can be made very thin (i.e., 0.001" or 0.002"), the fine pitch solder balls are relatively thick. FIG. 2C is a cross sectional view of the chip module assembly (200) taken along line 2C-2C in FIG. 2A, wherein it is shown that no cavity or aperture is formed in the LGA frame (221) in regions of the MCM substrate (202) that are not attached to the flexible circuits.

FIG. 2B illustrates an embodiment where an aperture (221a) is formed in the LGA plastic frame (221). However, since a typical thickness of the LGA frame (221) is about 0.030", a cavity may be formed in the frame (221) (as opposed to an aperture) as the flexible circuit is about 0.001" to 0.002" thick and the solder ball diameter is about 0.006" to 0.008". As noted above, other types of LGA interposers can be used in the exemplary embodiment of FIG. 2B, for instance, as long as the LGA interposers have a thickness that is greater than the thickness of the flexible circuit plus, e.g., the means used to electrically connect the flexible circuit to the MCM substrate, such as the diameter of the fine pitch solder balls.

It is to be appreciated that for a given-fixed chip module footprint, exemplary embodiments of the invention allow significant increases in module-to-board I/O interconnections using flexible circuits to expand the LGA area with additional I/O contacts, while not having to increase the chip module footprint (MCM substrate size). By way of example, as shown in FIG. 2A, most of the bottom surface area of the support frame (204) can be used for additional LGA connections, although some area is needed at two corners for the alignment pins (207) and at the center region of each side for the actuation hardware (208) used to apply a load and actuate the LGA. Moreover, by utilizing the area under the frame, additional I/O can be achieved without having to increase the footprint of the MCM assembly (200) or decrease the I/O pitch on the node card. The ability to achieve significant increases in I/O count is demonstrated by the following example.

Assume that a module having a package design as in FIGS. 2A-2C is constructed where the MCM (210) has a substrate (202) with a footprint of 93×93 mm with 5184 LGA connections to a node card and where the I/O contacts on the MCM substrate (202) are arranged as four arrays of 36×36 contacts. Assume further that the support frame (204) extends about 2 cm beyond the MCM substrate (202) on each side. If there is a 2 cm wide "keep-out" zone for the actuation hardware on the center of each side, there is still about 7.3×2 cm of additional LGA area available under the support frame (204) on each side of the MCM substrate (202). Assuming an LGA pitch of 1 mm, the additional area could support nearly as many I/O contacts as are provided on the bottom side of the MCM substrate (202). Depending on how close the MCM I/O contacts can be formed to the bottom surface edge of the MCM substrate (202), it may be necessary to replace some of the 1 mm pitch LGA contacts on the bottom of the MCM substrate (202) with 0.3 to 0.5 mm pitch pads for flexible circuit attachment sites. Notwithstanding, a significant increase in I/O count is possible due to the finer pitch of the flexible circuit attachment pads as compared to the LGA pads.

Figure 3:
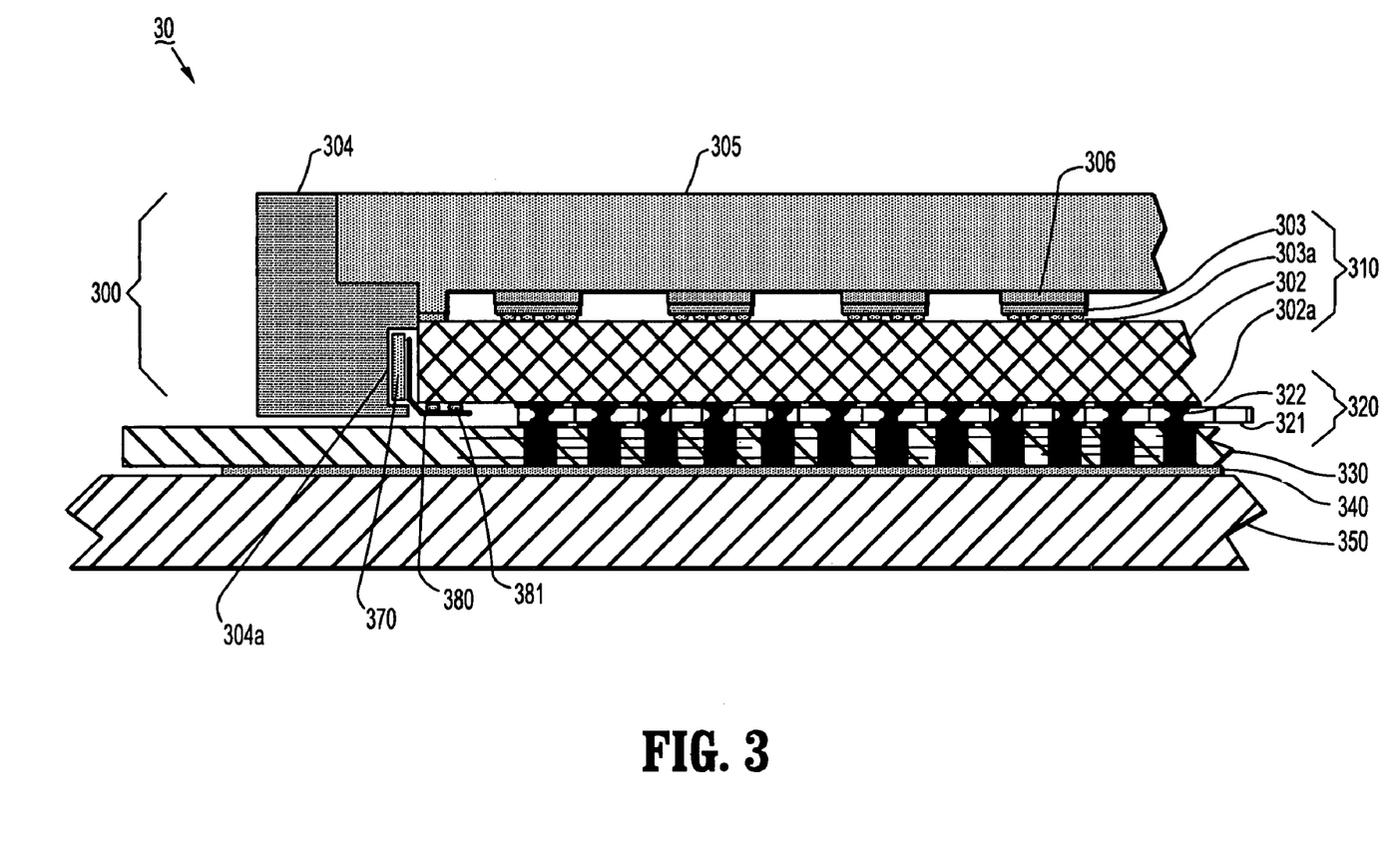
FIGS. 3-5 are schematic cross-sectional side views of electronic package structures to illustrate various methods for integrally packaging VPD modules with first level chip package structures, according to exemplary embodiments of the invention.
Figure 4:
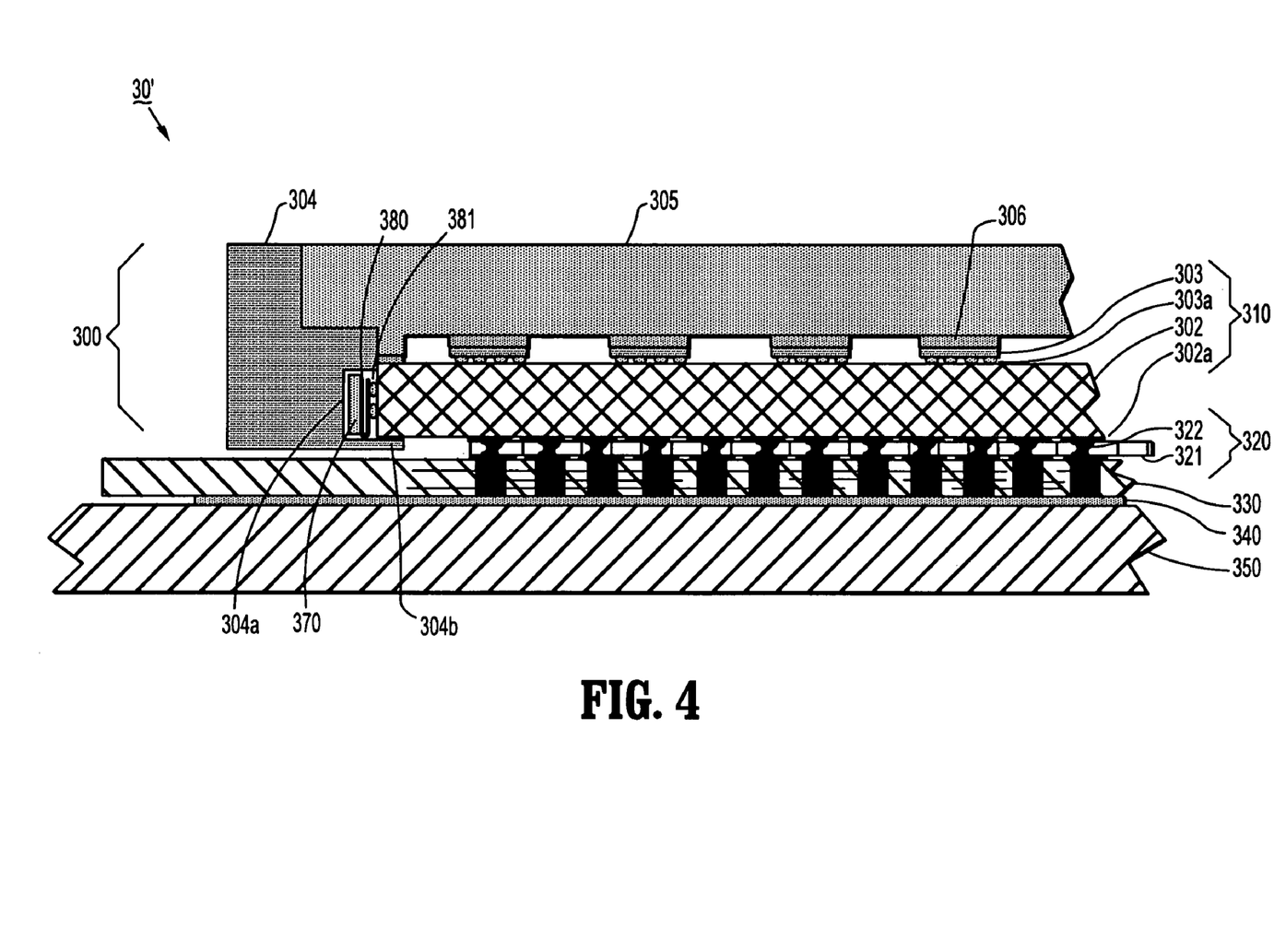
Figure 5:
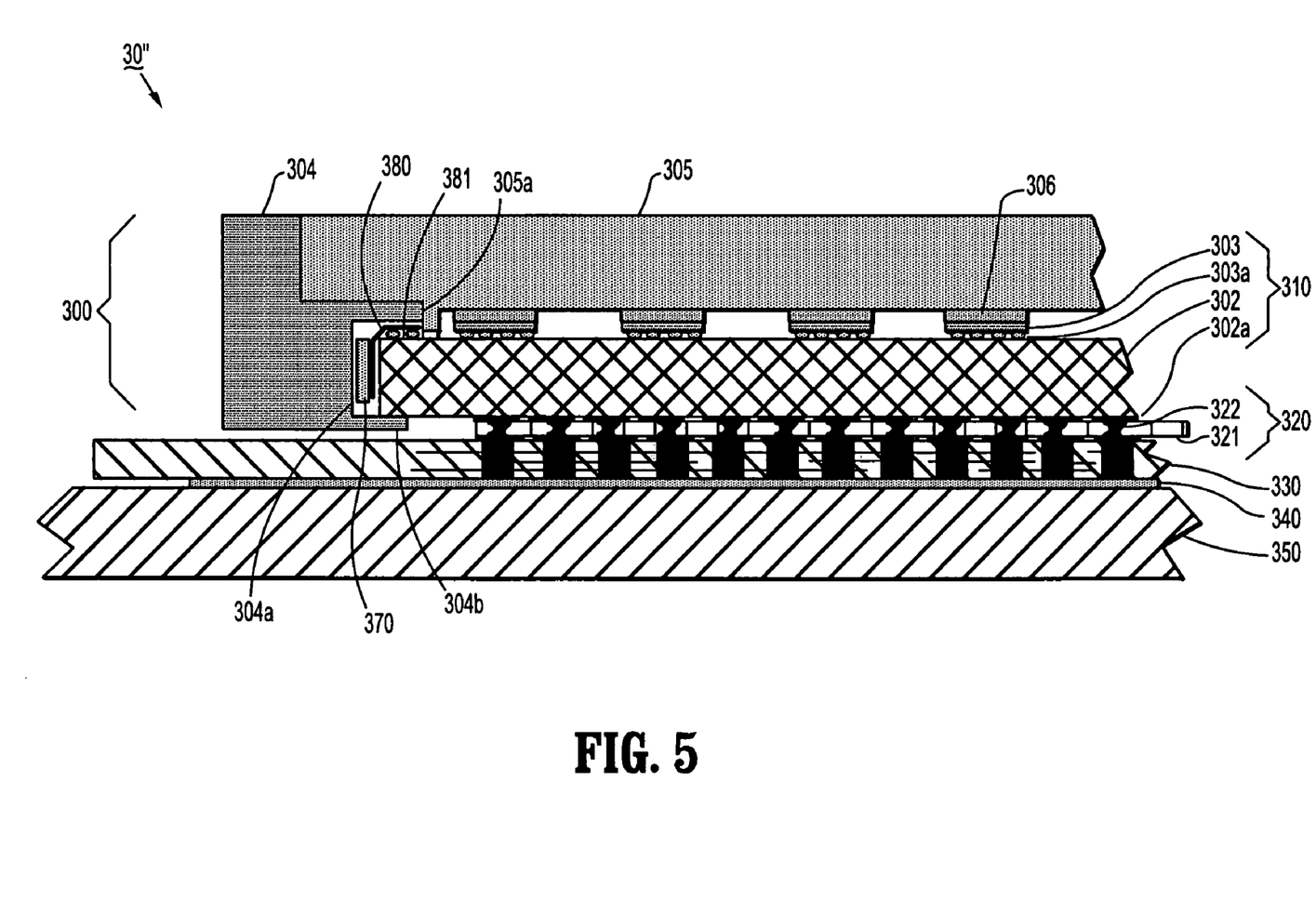

Exemplary embodiments of the invention further include improved packaging methods to integrate VPD modules containing the VPD information and monitoring or verification electronics into the MCM packaged in a tamper resistant manner without mounting the VPD module on the chip mounting surface of the MCM substrate. FIGS. 3-5 are schematic cross-sectional side views of electronic package structures that illustrate various methods for integrally packaging VPD modules with first level chip package structures, according to exemplary embodiments of the invention. The exemplary package structures are designed to prevent unauthorized removal, replacement and inspection of VPD modules.

In general, FIGS. 3, 4 and 5 schematically illustrate cross-sectional side views of electronic package structures (30), (30') and (30") having a similar configuration including a chip module assembly (300), an LGA interposer (320), an electrical circuit board (330) an insulator layer (340) and a stiffener plate (350). The chip module assembly (300) comprises an MCM (multi-chip module) (310), a metallic support frame structure (304) and a thermal hat (305). The MCM (310) includes a carrier substrate (302) with a plurality of IC chips (303) flip-chip mounted to an array of contacts formed on the top surface of the substrate (302) via micro-solder balls (303a). A thermal paste layer (306) is disposed between the back surface of the chips (303) and the thermal hat (305). The substrate (302) includes multiple levels of wiring and interconnects that provide electrical connections between top side contacts and other top side contacts or an area array of I/O contacts (302a) formed on the bottom side of the substrate (302).

In the exemplary embodiment of FIG. 3, the support frame (304) includes a cavity (304a) that contains a VPD module (370) mounted to a flexible circuit (380). The flexible circuit (380) is electrically interconnected to the bottom surface of the MCM substrate (302) using fine pitch solder balls (381) (0.3 to 0.5 mm pitch). Alternately, the flexible circuit could be connected to the MCM by directly soldering the flexible circuit to the MCM, using a conductive adhesive, or by use of an anisotropic conductive film (although fine pitch solder balls is one preferred method).

In the exemplary embodiment of FIG. 4, the cavity (304a) includes a VPD module (370) mounted to a flexible circuit (380) that is electrically interconnected to the sidewall surface of the MCM substrate (302) using fine pitch solder balls (381) (0.3 to 0.5 mm pitch) or other means as described above. In the exemplary embodiment, the cavity (304a) is fully enclosed by a lip portion (304b) that extends under the substrate (302) (which is to be contrasted to the exemplary embodiment of FIG. 3 wherein the cavity region (304a) has an opening through which the flexible circuit (380) extends through to make contact to the bottom surface of the MCM substrate (302)).

In the exemplary embodiment of FIG. 5, the cavity (304a) includes a VPD module (370) mounted to a flexible circuit (380) that is electrically interconnected to the upper surface of the MCM substrate (302) using fine pitch solder balls (381) (0.3 to 0.5 mm pitch) or other means as described above. The cavity region (304a) is formed to have a region that extends over the top side edge regions of the MCM substrate (302). In the exemplary embodiment of FIG. 5, the cavity (304a) is fully enclosed by a lip portion (304b) that extends under the substrate (302) and a lip portion (305a) of the thermal cap (305).

In each of the exemplary embodiments of FIGS. 3-5, the cavity region (304a) in the support frame (304) is formed only to house the VPD module (370) and does not extend to other regions of the frame (304). In particular, in regions of the supporting frame (304) that do not include a VPD module, no cavity region is formed and the frame (304) is in contact with the entire sidewall surface of the substrate (302) and a portion of the bottom surface of the substrate via lip portion (304*b*). In each of the exemplary embodiments of FIGS. 3-5, VPD module (370) could consist of a single chip, multiple chips, or a package substrate. An adhesive thermal pad could be used to secure the VPD module (370) to the inner cavity surface of the support frame (304) and provide a cooling path. The VPD module would consume little power and be accessed infrequently, so the cooling requirements would be modest.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An electronic apparatus, comprising:
    a first level package structure comprising a package substrate having one or more IC (integrated circuit) chips mounted on a first surface of the package substrate and a first array of contacts of pitch P1 formed on a second surface of the package substrate opposite the first surface;
    a second level package structure comprising a circuit board having a second array of contacts of pitch P1 formed on a first surface thereof;
    an LGA (land grid array) connector disposed between the first and second level package structures to provide electrical interconnections between the first and second array of contacts,
    a flexible circuit having a third array of contacts with pitch P1, a fourth array of contacts with pitch P2, and wiring to connect the third and fourth array of contacts; and
    a support frame structure disposed around an outer perimeter of the package substrate and having first and second opposing surfaces,
    wherein a portion of the flexible circuit having the third array of contacts is attached to the second surface of the support frame structure such that the third array of contacts is disposed between the second surface of the support frame structure and the LGA connector and such that the LGA connector provides electrical connections between the third array of contacts and the second array of contacts, and
    wherein a portion of the flexible circuit having the fourth array of contacts extends toward the package substrate to provide electrical connections between the flexible circuit and the first level package structure.

2. The apparatus of claim 1,
    wherein the second surface of the support frame structure is substantially coplanar with the second surface of the package substrate, and
    wherein the third array of contacts is substantially coplanar with the second surface of the package substrate and such that the fourth array of contacts is disposed between a peripheral region of the second surface of the package substrate and the LGA connector.

3. The apparatus of claim 2, wherein the LGA connector comprises:
    a substrate having a first mating surface that mates with the first level package structure and a second mating surface that mates with the second level package structure;
    a fifth array of contacts disposed on the first mating surface, wherein the fifth array of contacts is matched and aligned to the first and third array of contacts;
    a sixth array of contacts disposed on the second mating surface and matched and aligned to the second array of contacts; and
    electrical interconnects that connect corresponding contacts in the fifth and sixth array of contacts.

4. The apparatus of claim 1, wherein the fourth array of contacts of the flexible circuit are electrically connected to signal pads on the package substrate using solder connections, or a conductive adhesive or anisotropically conductive film.

5. The apparatus of claim 4, wherein the fourth array of contacts are electrically connected to the signal pads on the second surface of the package substrate.

6. The apparatus of claim 1, wherein the first level package structure is an MCM (multi-chip module), wherein the package substrate is formed of ceramic.

7. The apparatus of claim 1, wherein the pitch P2 is less than the pitch P1.

8. An electronic apparatus, comprising:
    an MCM (multi-chip module) comprising a ceramic substrate having a plurality of IC (integrated circuit) chips mounted on a first surface of the ceramic substrate and a first array of contacts of pitch P1 formed on a second surface of the ceramic substrate opposite the first surface;
    a support frame structure disposed around an outer perimeter of the ceramic substrate, wherein the support frame structure has first and second opposing surfaces;
    an electrical circuit board comprising a second array of contacts of pitch P1; and
    an LGA (land grid array) connector disposed between the MCM and the electrical circuit board, wherein the LGA connector provides electrical connections between the first and second array of contacts; and
    a flexible circuit having a third array of contacts with pitch P1, a fourth array of contacts with pitch P2, and wiring to connect the third and fourth array of contacts,
    wherein a portion of the flexible circuit having the third array of contacts is attached to the second surface of the support frame structure such that the third array of contacts is disposed between the second surface of the support frame structure and the LGA connector and such that the LGA connector provides electrical connections between the third and second array of contacts, and
    wherein a portion of the flexible circuit having the fourth array of contacts extends toward the ceramic substrate wherein the fourth array of contacts are electrically connected to contacts on the ceramic substrates.

9. The apparatus of claim 8,
    wherein the second surface of the support frame structure is substantially coplanar with the second surface of the ceramic substrate, and
    wherein the third array of contacts is substantially coplanar with the second surface of the ceramic substrate and such that the fourth array of contacts is disposed between a peripheral region of the second surface of the ceramic substrate and the LGA connector.

10. The apparatus of claim 8, wherein the fourth array of contacts of the flexible circuit are electrically connected to the contacts of the ceramic substrate using solder connections, or a conductive adhesive or an anisotropically conductive film.

11. The apparatus of claim 8, wherein the fourth array of contacts are electrically connected to contacts on the second surface of the ceramic substrate.

12. The apparatus of claim 8, wherein the pitch P2 is less than the pitch P1.

13. The apparatus of claim 8, wherein the plurality of IC chips include central processing units.

14. The apparatus of claim 8, wherein the LGA connector includes wadded wire contact structures.

* * * * *